United States Patent [19]

Cedrone et al.

[11] Patent Number: 4,546,404
[45] Date of Patent: Oct. 8, 1985

[54] STORAGE UNIT FOR AN INTEGRATED CIRCUIT TESTER

[75] Inventors: Nicholas J. Cedrone, Wellesley Hills; Kenneth R. Lee, Lincoln, both of Mass.

[73] Assignee: Daymarc Corporation, Waltham, Mass.

[21] Appl. No.: 497,272

[22] Filed: May 23, 1983

[51] Int. Cl.4 .............................................. H05K 7/14
[52] U.S. Cl. ...................................... 361/331; 29/759; 312/97.1
[58] Field of Search ............................ 211/1.5; 29/759; 324/158 F; 312/97.1, 135, 305; 361/331, 417, 418, 380, 419, 420, 429; 193/2 R

[56] References Cited
U.S. PATENT DOCUMENTS

| | | |
|---|---|---|
| 988,297 | 4/1911 | Barrow et al. ............... 312/97.1 |
| 2,517,532 | 8/1950 | Carew et al. ............... 312/97.1 |
| 3,620,363 | 11/1971 | Donnithorne ............... 312/97.1 |
| 3,674,155 | 7/1972 | Kessler .......................... 211/1.5 |
| 4,142,649 | 3/1979 | Forgey ....................... 312/97.1 |
| 4,314,628 | 2/1982 | Calbert et al. .................. 193/2 R |

OTHER PUBLICATIONS

Daymarc Corporation 1152 HL Product Bulletin, "Integrated Circuit Sorter".
Delta Design, Inc. 8085 Product Bulletin, "Centurion I".

Primary Examiner—A. D. Pellinen
Assistant Examiner—Gregory D. Thompson
Attorney, Agent, or Firm—Kenway & Jenney

[57] ABSTRACT

Integrated circuits (IC's) are stored for a time interval in a set of elongated guideways to bring them to a preselected temperature prior to testing. The guideways each hold a line of IC's in a loose end-to-end array. A frame carries the guideways. The frame and guideways rotate about a central shaft that is generally aligned with the guideways. The guideways are rotatably mounted in the frame and a gear system, preferably one carried on the frame and the guideways, ensures that as the frame rotates the guideways maintain the same angular orientation with respect to the horizontal. In the preferred form the guideways are generally tubular members with an upwardly facing open channel and an opposed, spaced apart rail that retain and guide the IC's. The entire frame and the guideways carried in the frame are inclined from the horizontal to provide a gravity feed of the IC's from one of the guideways located at an "unloading" position.

18 Claims, 6 Drawing Figures

STORAGE UNIT FOR AN INTEGRATED CIRCUIT TESTER

BACKGROUND OF THE INVENTION

This invention relates in general to test equipment for electronic devices. More specifically, it relates to a storage unit that continuously receives, holds, and then discharges integrated circuits (IC's) to a tester.

In the manufacture and use of IC's it is necessary to test them reliably and rapidly. Many IC's must be heated uniformly to a preselected temperature prior to testing to simulate actual operating conditions. Therefore modern high speed testing equipment must include a time delay storage device that can heat the IC's to a preselected temperature during a time interval. The storage unit must also be able (1) to receive the IC's from "tubes" or "sticks" where they are stored in an end-to-end linear array (2) to discharge them quickly and reliably at an input to the testing area, and (3) to store any standard size IC with little or no interruption of the testing process and not degradation of the performance of the storage unit.

One known approach to time-delay storage is to load the IC's from a tube into one or more holding rails that are mounted generally parallel to one another and in a circle. This assembly rotates about the common axis of rotation located at the center of the circle and inclined with respect to the ground. In this prior art arrangement, the IC's are loaded onto the rails at one angular position and discharged at another. The time delay and heating occurs as the rails rotate between these positions. The IC's held in a rail are loosely loaded, that is, there is some "play" or clearance in the line. This characteristic is important in order to have the IC's slide freely along the rail and to accommodate IC's having different sizes.

This "rotating rail" approach, however, has not found wide acceptance. A principal reason is that as the rails rotate, the IC's stored on the rails shift their positions with respect to one another so that at least some of them usually become wedged against the guide surfaces of the rails. Once the line of IC's on a rail is thus jammed, it will not discharge the IC's "behind" the jam point. This interrupts the flow of IC's to the tester and reduces the operating speed of the entire tester. (IC's have a generally rectangular, box-like body usually formed of a ceramic (or plastic) with leads emerging from opposite side faces of the body and projecting generally in a direction normal to one face of the body.)

Another approach to the storage problem has been to feed the IC's onto a carousel that extends generally in a horizontal plane. The IC's are arrayed about the periphery of the carousel. The carousel rotates each IC from a loading point to a discharge point. During this rotation the IC's are in a heated environment that brings them up to the desired testing temperature. The Type 1157 HL tester manufactured by Daymarc Corporation, the assignee of the present application, utilizes this carousel approach. While the carousel works well, it requires precise and costly machining of numerous parts. In addition, the close tolerances of peripheral openings on the carousel can become misaligned in normal handling resulting in the malfunctioning of some of the IC holding positions on the carousel. Further, the horizontal orientation of the carousel can place constraints on the type of testing circuitry that can be used or on the spacing between the circuitry and the site where the IC's are connected to the circuitry and tested. These geometrical considerations can be quite important since many IC's are very high speed devices and the quality and reliability of the test depends on placing the test circuitry extremely close to the IC being tested. However, alternate arrangements using a horizontal carousel which do not restrict the tester are possible.

It is therefore a principal object of the present invention to provide a storage unit for IC's that reliably and rapidly loads and unloads a line of loosely-loaded IC's to feed a tester.

Another object of this invention is to provide a storage unit that has a favorable cost of manufacture as compared to carousel type IC storage units presently in use.

Yet another object is to provide an IC storage unit with the foregoing advantages that can receive, store and discharge IC's having any of the standard sizes without jams.

A further object is to provide a storage unit with the foregoing advantages that is comparatively rugged and has no sensitive adjustments or components that are readily damaged in normal handling.

Still another object is to provide an IC storage unit that is compact and mates with a tester in a manner that does not limit the type of test circuitry or its positioning with respect to the tester.

SUMMARY OF THE INVENTION

A time-delay storage unit that automatically and continuously receives, stores, and discharges integrated circuits (IC's) is organized around a frame assembly that rotates about an axis of rotation that is inclined with respect to the horizontal. In the preferred form the frame includes a central shaft that extends along the axis of rotation and a pair of end plates rotatably mounted on the shaft. The end plates in turn rotatably mount a set of generally parallel, elongated guideways that are arrayed concentrically about the axis of rotation. The guideways each receive, store, and then discharge a line of IC's that slide into and out of the storage unit in a loosely-packed, linear, end-to-end array. The unit includes a drive system that indexes the frame and the guideways carried on the frame through a series of angular positions including an IC load position and an IC unload position.

The storage unit includes a mechanical arrangement that maintains the IC's held in the guideways at a substantially constant angularly orientation with respect to the horizontal despite the fact that the frame assembly as a whole, including the set of guideways, rotates. While the end result can be achieved using belts or chains, in the preferred form the mechanical arrangement is a gear system including a stationary gear fixed on each end of the central shaft, a set of planetary idler gears arrayed about and meshed with each of the fixed gears, and gears fixed on each end of the guideways and meshed with one of the idler gears.

The guideways include a generally tubular support member. Within the tubular structure are mounted an upwardly facing open channel and an opposed rail that together guide a line of IC's as they slide into and out of the guideway and secure them to some extent while they are stored in the guideway. The channel has a smooth, generally flat floor and side walls that are spaced apart sufficiently to accommodate the widest standard IC. The floor is preferably loosely mounted in the tubular support frame to allow a vibration of the guideways to facilitate movement of the IC's at a low angle of inclination. Narrow IC's are guided by their "inside" leads (as are wide IC's if the "outer" side wall is missing). The position of the rail is adjustable vertically to accommodate IC's of varying thickness. The lower end of each guideway is selectively blocked by a movable stop element or gate. The gate is preferably a pivoted member biased towards a closed position that holds the IC's in the guideway. A cam member moves the gate to an open position when the associated guideway is at the "unload" position.

The frame and guideways are supported in an enclosed housing that is preferably insulated and contains a heating system. The housing walls or associated mechanisms support a pair of brackets that receive mating portions of the central shaft to provide a "drop-in" replacement of the entire frame assembly. The storage unit also preferably includes a drive shaft (or an equivalent element such as a drive belt) extending generally parallel to the axis of rotation of the frame assembly. Drive gears fixed on the drive shaft engage drive gears coupled to the central shaft. In the preferred form, the end plates of the frame are themselves rotating gears that mate with the drive gears.

These and other features and objects of the present invention will be understood more fully from the accompanying detailed description which should be read in light of the accompanying drawings.

DETAILED DESCRIPTION OF THE PREFERRED EMBODIMENTS

Figure 1:
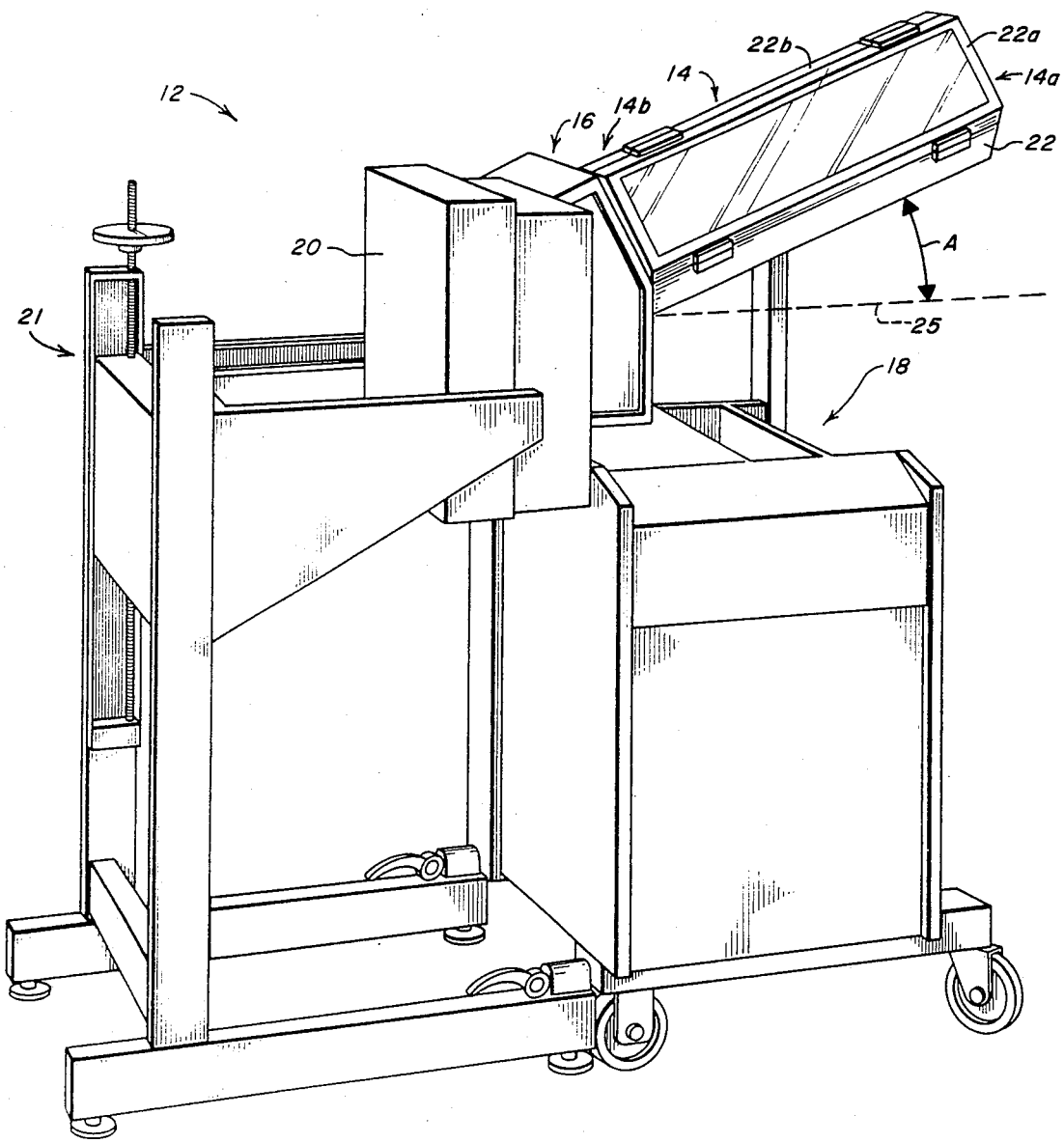
FIG. 1 is a simplified view in perspective of a machine for testing IC's that utilizes a storage unit according to the present invention.

FIG. 1 shows an integrated circuit (IC) tester 12 that includes a storage unit 14, a test assembly 16, a sorter 18 and test circuitry 20 mounted on a frame 21 and positioned immediately adjacent a test site for the IC's in the test assembly 16. The storage unit includes an outer insulated enclosure or housing 22. It is generally box-like and includes a hinged door 22a that allows ready access to the interior of the housing where a frame assembly 24 (FIGS. 2-5) and associated guideways 26 (FIGS. 2-6) carried on the frame are mounted. It also includes conventional heating elements and controls (not shown) that can raise the temperature of the IC's held in the storage unit to a preselected pretesting temperature T during the time interval between when an IC is first loaded into the storage unit and when it is discharged to the assembly 16 for testing.

The entire housing 22, as well as the frame assembly 24, are inclined at an acute angle A with respect to the horizontal (indicated by dashed line 25). With this inclined orientation, IC's loaded into the storage unit at its elevated end 14a are gravity fed to its lower end 14b where they are discharged to the test assembly 16. A significant aspect of the present invention is that the storage unit is (1) comparatively compact and (2) located on the opposite side of the test assembly 16 from the test circuitry 20 and its frame 21 so that it does not limit or constrain the size, configuration or location of the circuitry 20 with respect to the test assembly 16. This is important because for many tests the quality of the test is very sensitive to the spacing between the test circuitry and the IC undergoing a test at the test site.

Figure 2:
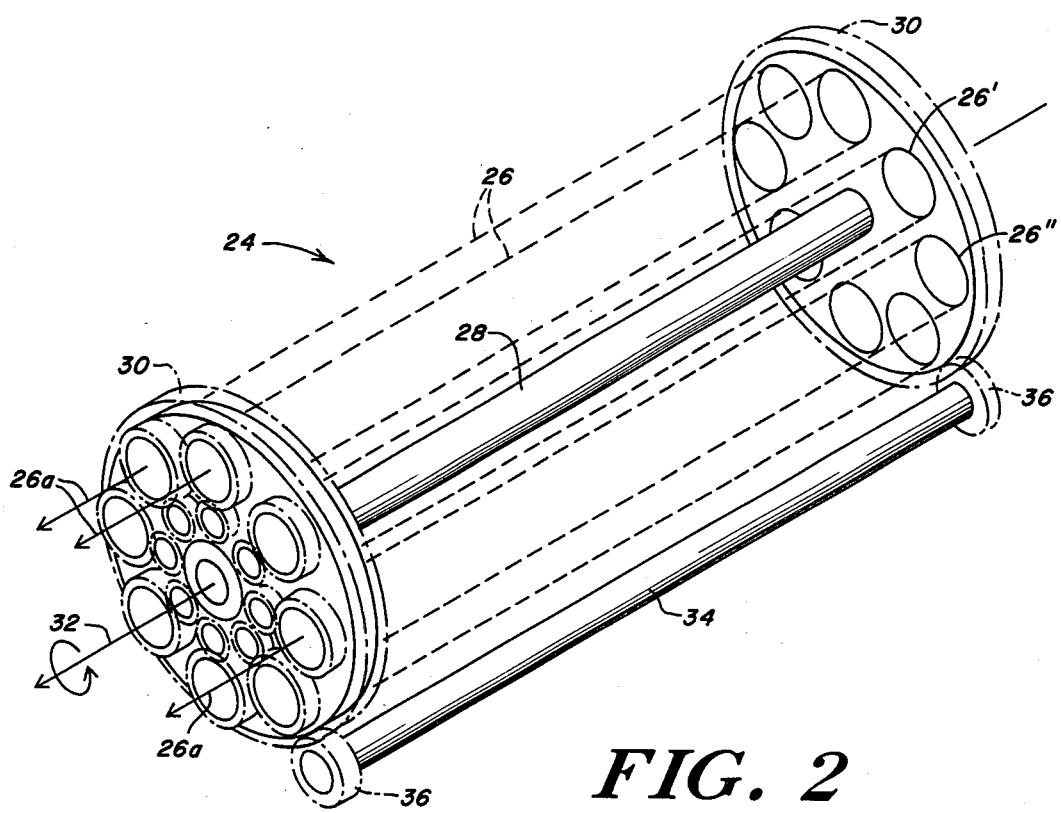
FIG. 2 is a simplified view in perspective of the frame assembly, including tube-like guideways, and drive shaft of the storage unit shown in FIG. 1 with the surrounding housing and other components omitted for clarity.
Figure 3:
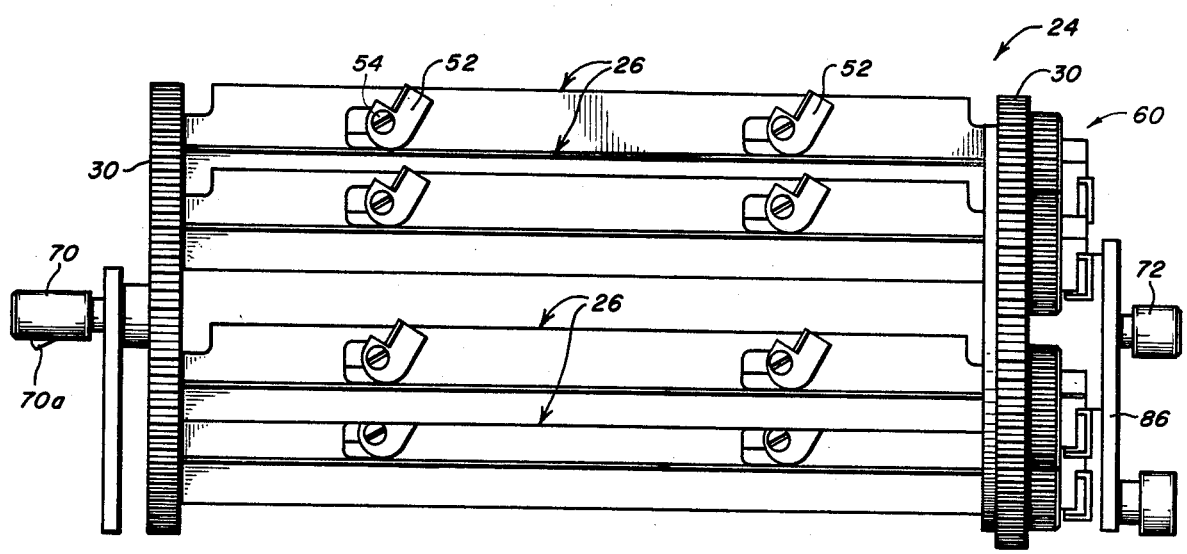
FIG. 3 is a more detailed view in side elevation of the frame assembly shown in FIG. 2.
Figure 4:
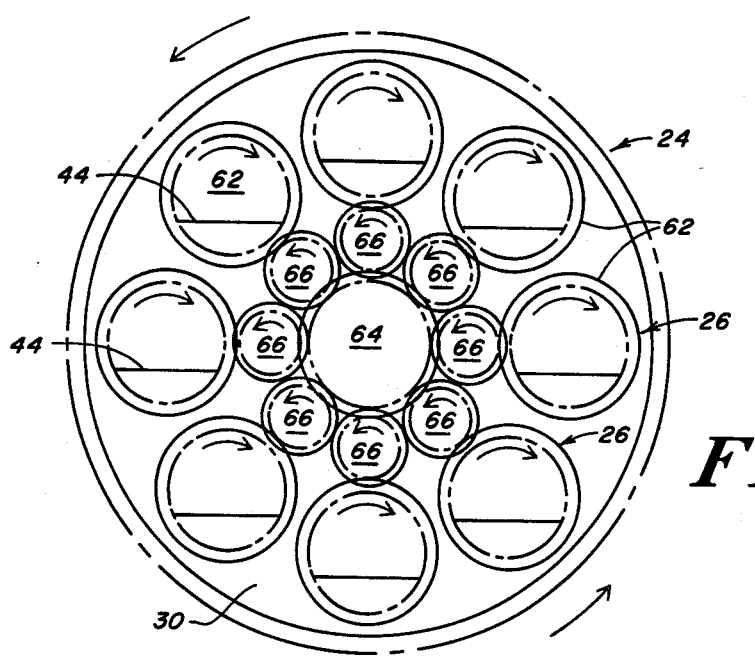
FIG. 4 is a simplified view in side elevation of the lower end of the assembly shown in FIG. 2 with the drive shaft omitted.
Figure 5:
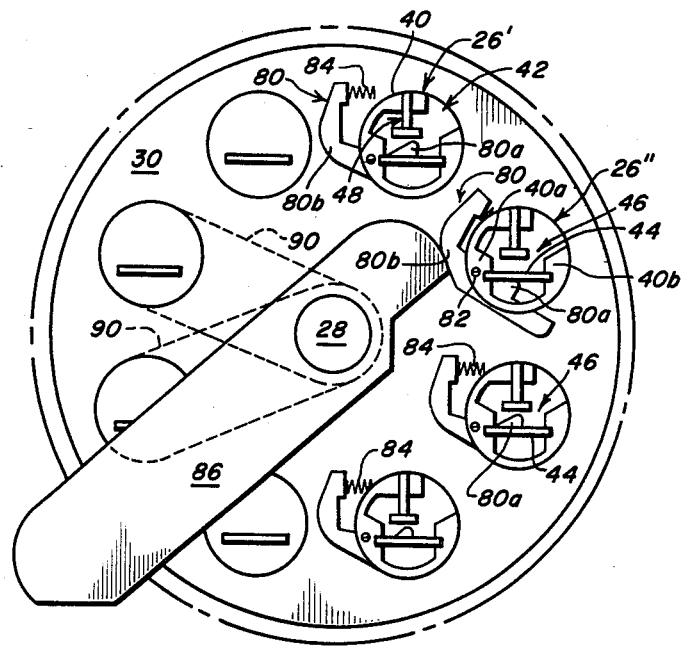
FIG. 5 is a more detailed view corresponding to FIG. 4 showing the cammed gate arrangement for controlling the discharge of IC's from the guideways.

With particular reference to FIGS. 2-4, the frame assembly 24 is organized about a central shaft 28 and a pair of end plates 30,30 rotatably mounted on opposite ends of the shaft and oriented generally perpendicular to the shaft 28. The guideways 26 are each rotatably mounted in the end plates and equiangularly spaced along a circle that is concentric with the shaft 28. The end plates and guideways rotate in a step-wise manner (index) about an axis of rotation 32 aligned with the central longitudinal axis of the shaft 28. As the frame assembly 24 indexes, each guideway rotates sequentially between a number n of preselected angular positions 29 which is at least equal to the number of guideways. As illustrated, there are eight guideways and each angular position is therefore spaced 45° from its adjacent position. One position, occupied by guideway 26' in FIGS. 2 and 5, is a "load" position where a line of IC's are fed from a tube into a guideway while the guideway is momentarily at rest. Another position, occupied by guideway 26" in FIGS. 2 and 5, is an "unload" position where the line of IC's (also stored in a loosely-loaded, linear, end-to-end array along the guideway) is discharged from the guideway under the influence of gravity, to the test assembly 16. The "load" and "unload" positions are selected so that a line of IC's loaded into a guideway for storage must rotate through n-1 angular positions 29 before it reaches the unload position. (Of course, rotation through n-2, n-3 or other fewer positions is possible, but with a resulting decrease in the duration of the storage time in the unit 14.)

A drive shaft 34 (FIG. 2) is mounted in the housing 22 adjacent and generally parallel to the frame assembly 24. The shaft 34 carries drive gears 36,36 secured to the shaft and adapted to mesh with gear teeth formed on the periphery of each end plate 30,30. The shaft is driven by a conventional motor (not shown) also mounted on the housing 22.

Figure 6:
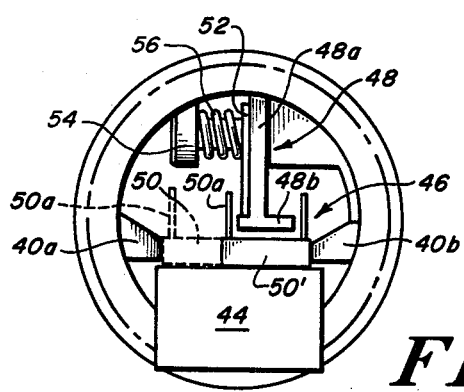
FIG. 6 is a detailed view in cross section of one of the guideways shown in FIGS. 2-5 with an IC stored in the guideway.

Each guideway 26 has a generally tubular configuration as shown in FIG. 2 and extends between the end plates along its axis of rotation 26a. The axes 26a are mutually parallel to one another and the axis of rotation 32. As is best seen in FIGS. 3, 5 and 6, each guideway has a tubular outer support member 40 with an opening 42 at one sector along most of its length (FIG. 5). This hollow support members 40 mounts a generally flat floor member 44 which together with side walls 40a and 40b of the member 40 form an upwardly facing channel 46 that receives, holds and guides the IC's.

The members forming the channel 46 are preferably formed of a material that has a comparatively low coefficient of friction with respect to the material forming the body of the IC's in order to facilitate a sliding movement of the IC's through the guideway. In addition, the floor member 44 is preferably loosely mounted in the channel 46 so that it can be force vibrated to reduce the dynamic friction acting on the IC's and produce a "floating" movement along the channel. This allows the use of a smaller angle A and therefore the IC's exiting the storage unit 14 have a lower velocity than with a steeper angle A.

The width of the floor member 44 and the lateral spacing of the side walls 40a,40b is sufficient to accommodate the largest standard size IC 50 (as shown in phantom in FIG. 6). Smaller IC's 50' rest on the floor with one side adjacent the "inner" wall 40b as shown in full lines in FIG. 6. In either case, a rail member 48 having a plate-like support 48a and a flange 48b at its lower end opposes the channel 46 and is located laterally at a point where the flange 48b rests between the upwardly projecting leads 50a of the IC's regardless of their size. The rail 48, and particularly the flange 48b which is preferably closely space from the upper faces of the IC's, together with the channels 46 therefore provide a positive guideway that (1) assists in holding the IC's of different widths in the desired linear array despite their loose-packed condition and (2) guides the IC's as they are loaded into and discharged from the guideway 46.

As is best seen in FIGS. 3 and 6, the rail member 48 is vertically adjustable with respect to the floor member 44 using cam plates 52 each pivotally mounted on a pin 54 secured to an adjacent portion of the support member 40. A spring 56 captured under the head of the pin 54 urges each cam plate into a face-abutting relationship with the adjacent face of the rail portion 48a. The angular portion of the two cam plates 52 associated with each rail 48 determines its vertical position. The position of the rail is adjusted to provide a close, but loose control over the orientation and location of IC's of varying body thickness.

A principal feature of the present invention is a gear system 60 that maintains each of the guideways at a substantially constant angular orientation with respect to the horizontal as the frame assembly 24 indexes through the n angular positions 29. To this end, each guideway is rotatably mounted in the end plates 30,30 (as with a conventional bearing assembly) and has a gear 62 fixed at both of its ends. Similarly, gears 64 are fixed on opposite ends of the central shaft 28 adjacent the outer faces of the end plates 30,30. (Note that the shaft 28 can be omitted provided the gears 64 and the end plates 30, 30 ae suitably mounted.) The end plates each carry a set of n planetary idler gears 66 mounted for free rotation. The gears 66 on each plate are intermeshed between the shaft gear 64 and one of the guideway gears 62. The gears 66 do not intermesh with one another. The gear ratios of each of the gears 62,64,66 trains are selected so that as the frame assembly is rotated, the gears 62 and 66 rotate around the fixed shaft gear 64 to maintain the angular orientation of the gear 66 with respect to the horizontal constant. Because the gear 66 is fixed on the freely rotatable guideway and is aligned with the axis of rotation of the associated guideway, it also remains at a constant angular orientation.

As shown in FIG. 4, as the end plate 30 rotates counter-clockwise, the idlers 66 secured on the end plates also rotate counterclockwise over the fixed gear 64. This drives each of the guideway gears in a clockwise rotation. If the diameter of the gear 64 and the guideway gears 62 is the same, as shown, then, assuming the guideways are assembled and mounted in the frame assembly 24 with a horizontal orientation (the floors 44 parallel to the horizontal when viewed in a plane perpendicular to the axes of rotation), they will maintain this orientation.

While a preferred form of the gear system 60 has been illustrated and described, it will be understood that other mechanical arrangements can achieve the same end result. For example, it is possible to produce the desired rotation of the guideways in coordination with the rotation of the frame assembly using a gear system of the type described above at only one end of the frame assembly rather than at both ends. It is also possible to produce the same epicyclic motion of the guideways using positive drive systems other than gears. For example, multiple belts 90 (FIG. 5) or chains can perform a function equivalent to that of the idler gears 66. If belts or chains are used, the central pulley or sprocket 64 should again have the same diameter as the pulleys or sprockets 62.

The central shaft 28 also carries mounting members 70,72 at its extreme ends. The member 70 has a projection 70a that is received in a mating recess that prevents its rotation.

The raised end of each guideway is open to receive a line of IC's from any suitable loading system. The lower end is usually closed by a gate 80 that is pivotally mounted on a pin 82. A portion 80a of each gate blocks the lower end of guideway to prevent the IC's stored in the guideway from sliding out. A spring 84 urges the gate into the closed position shown in connection with tube 26' in FIG. 5. As the frame assembly rotates a guideway into the unload position, a roller on a fixed cam bar 86 engages a portion 80b of the gate causing the gate to pivot against the force of the spring 84 to an open position shown in connection with guideway 26" in FIG. 5. In the open position, the portion 80a is clear of the channel 46 and IC's stored in the guideway are free to slide out of the guideway and into the testing assembly 16. As shown, the cam bar 86 also mounts the drive shaft 34.

While the invention has been described with respect to its preferred embodiment, it will be understood that various modifications and alterations will occur to those skilled in the art. It is intended that such modifications and variations fall within the scope of the appended claims.

What is claimed is:

1. Storage means for a tester of integrated circuits comprising, a set of elongated guideways that can each hold a plurality of integrated circuits in a relatively loose, end-to-end abutting alignment, a frame that carries said guideways, said frame having a central axis of rotation and said guideways being arrayed about said axis of rotation, wherein said guideways are each rotatable with respect to said frame about their own longitudinal axis, means rotating said frame in a step-wise manner about said axis of rotation through a preselected number of angular positions that include a load position where integrate circuits can be loaded into one of said guideways and a feed position where integrated circuits are discharged from of said guideways, and means maintaining said guideways at a substantially constant angular orientation with respect to the horizontal as said frame rotates through said angular positions,
wherein said central axis and said guideways are inclined with respect to the horizontal so that integrated circuits are loaded into and fed from said guideways using the force of gravity 2. The storage means according to claim 1 wherein said guideways are each rotatable with respect to said frame about their own longitudinal axis and wherein said orientation maintaining means comprises gear means that engages each of said guideways and controls its angular orientation about its longitudinal axis.

3. The storage means according to claims 1, or 2 wherein said frame includes a central shaft about which said frame rotates and a pair of end plates mounted transversely on said central shaft.

4. The storage means according to claim 2 wherein said gear means includes at least one gear secured on said shaft near one of said end plates and a set of planetary idler gears mounted for free rotation on said end plates and each engaged to said shaft mounted gear.

5. The storage means according to claim 4 wherein said gear means further includes a guideway gears secured to the ends of said guideways and engaged with an associated one of said idler gears whereby said rotation of said frame causes a rotation of said idler and guideway gears to provide said substantially constant angular orientation.

6. The storage means according to claim 3 further comprising a housing that encloses said frame and said guideways, said housing including a pair of spaced apart mounting brackets, and wherein said central shaft has end portions that are replaceably received in said mounting brackets.

7. The storage means according to claim 6 wherein said housing means is insulated.

8. The storage means according to claims 1, or 2 wherein each of said guideways include an upwardly facing open channel that stores and guides integrated circuits.

9. The storage means according to claim 8 wherein each of said guideways further include a rail member that opposes and is spaced apart from said channel to provide further control and guidance over the orientation and movement of said integrated circuits in said guideways.

10. The storage means according to claim 9 wherein each of said guideways further comprises an elongated member that supports said rail member and said channel.

11. The storage means according to claim 10 wherein said elongate support member has a generally tubular configuration.

12. The storage means according to claim 10 wherein said channel includes a floor member mounted in said support member and a pair of side walls extending along said floor member the length of said guideway.

13. The storage means according to claim 12 wherein each said floor member is sufficiently wide to accommodate any standard size integrated circuit held in said channel in an end-to-end abutting relationship.

14. The storage means according to claim 12 wherein said floor member is loosely mounted in said support member to promote a vibratory movement of integrated circuits along said guideways.

15. The storage means according to claim 1 wherein said orientation maintaining means comprises belt means operatively coupled to said guideways.

16. The storage means according to claim 9 further comprising means adjusting the vertical height of each said rail member with respect to the associated one of said channels.

17. The storage means according to claim 8 further comprising gate means mounted at the lower end of each of said guideways that close to hold said integrated circuits in said guideways and open when the associated guideway is said unload position to allow the discharge of integrated circuits from said guideway.

18. The storage means of claim 17 wherein said gate means comprises a pivoted stop member, means urging said stop member towards a closed position, and cam means pivoting said stop member against said urging means to an open position.

* * * * *